(12) United States Patent
Seong et al.

(10) Patent No.: US 7,848,141 B2
(45) Date of Patent: Dec. 7, 2010

(54) MULTI-LEVEL CELL COPYBACK PROGRAM METHOD IN A NON-VOLATILE MEMORY DEVICE

(75) Inventors: Jin Yong Seong, Seoul (KR); Seong Je Park, Sacheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 70 days.

(21) Appl. No.: 11/926,130

(22) Filed: Oct. 29, 2007

(65) Prior Publication Data
US 2008/0101116 A1 May 1, 2008

(30) Foreign Application Priority Data
Oct. 31, 2006 (KR) .................. 10-2006-0106654
Jun. 4, 2007 (KR) .................. 10-2007-0054383

(51) Int. Cl.
*G11C 11/34* (2006.01)
(52) U.S. Cl. .................. 365/185.03; 365/185.12; 365/185.21; 365/185.22
(58) Field of Classification Search ............ 365/185.03, 365/185.05, 185.11, 185.12, 185.17, 185.18, 365/185.22, 185.25, 185.29, 185.33, 185.21
See application file for complete search history.

(56) References Cited

U.S. PATENT DOCUMENTS

| 6,671,204 | B2 * | 12/2003 | Im ................... | 365/185.12 |
| 6,826,082 | B2 * | 11/2004 | Hwang et al. ........ | 365/185.17 |
| 7,102,927 | B2 * | 9/2006 | Jo ..................... | 365/185.12 |
| 7,227,785 | B2 * | 6/2007 | Lee et al. ............ | 365/185.12 |
| 7,257,027 | B2 * | 8/2007 | Park ................... | 365/185.11 |
| 7,295,470 | B2 * | 11/2007 | Park et al. ........... | 365/185.12 |
| 7,301,825 | B2 * | 11/2007 | Seong et al. ......... | 365/185.03 |
| 7,307,890 | B2 * | 12/2007 | Son ................... | 365/185.12 |
| 7,313,028 | B2 * | 12/2007 | Ju ..................... | 365/185.25 |
| 7,336,543 | B2 * | 2/2008 | Chen et al. .......... | 365/185.11 |
| 7,417,899 | B2 * | 8/2008 | Lee ................... | 365/185.22 |
| 7,466,597 | B2 * | 12/2008 | Kim ................... | 365/185.17 |
| 7,483,301 | B2 * | 1/2009 | Hwang ............... | 365/185.12 |
| 7,515,472 | B2 * | 4/2009 | Chung ................ | 365/185.22 |
| 2006/0279989 | A1 | 12/2006 | Seong et al. | |

FOREIGN PATENT DOCUMENTS

| KR | 10-2006-0016553 A | 2/2006 |
| KR | 10-2007-0000009 A | 1/2007 |

* cited by examiner

*Primary Examiner*—Trong Phan
(74) *Attorney, Agent, or Firm*—Townsend and Townsend and Crew LLP

(57) ABSTRACT

A multi-level cell copyback program method in a non-volatile memory device is disclosed. The method includes reading LSB data of a source page, and storing the read LSB data in a second register of a page buffer, transmitting the data stored in the second register to a first register coupled to a data inputting circuit, and storing the transmitted data in the first register, amending the data stored in the first register through the data inputting circuit, transmitting the amended data to the second register, and storing the transmitted data in the second register, and LSB-programming corresponding data to a target page in accordance with the data stored in the second register.

6 Claims, 9 Drawing Sheets

FIG. 1
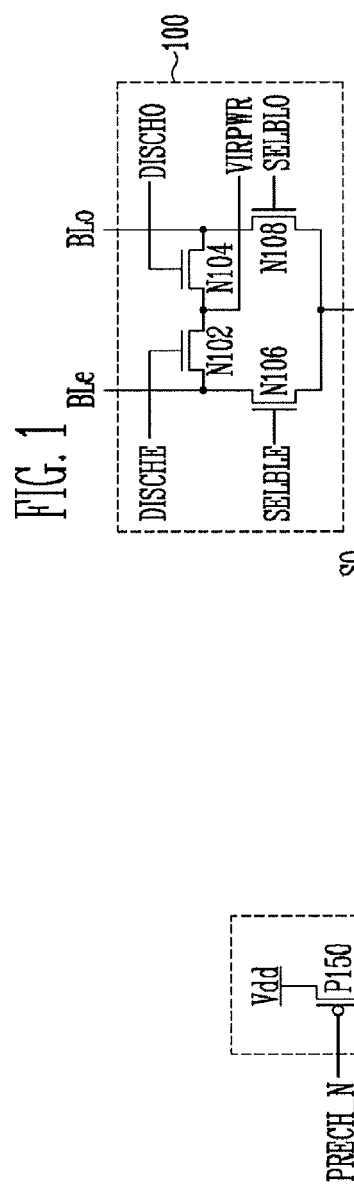
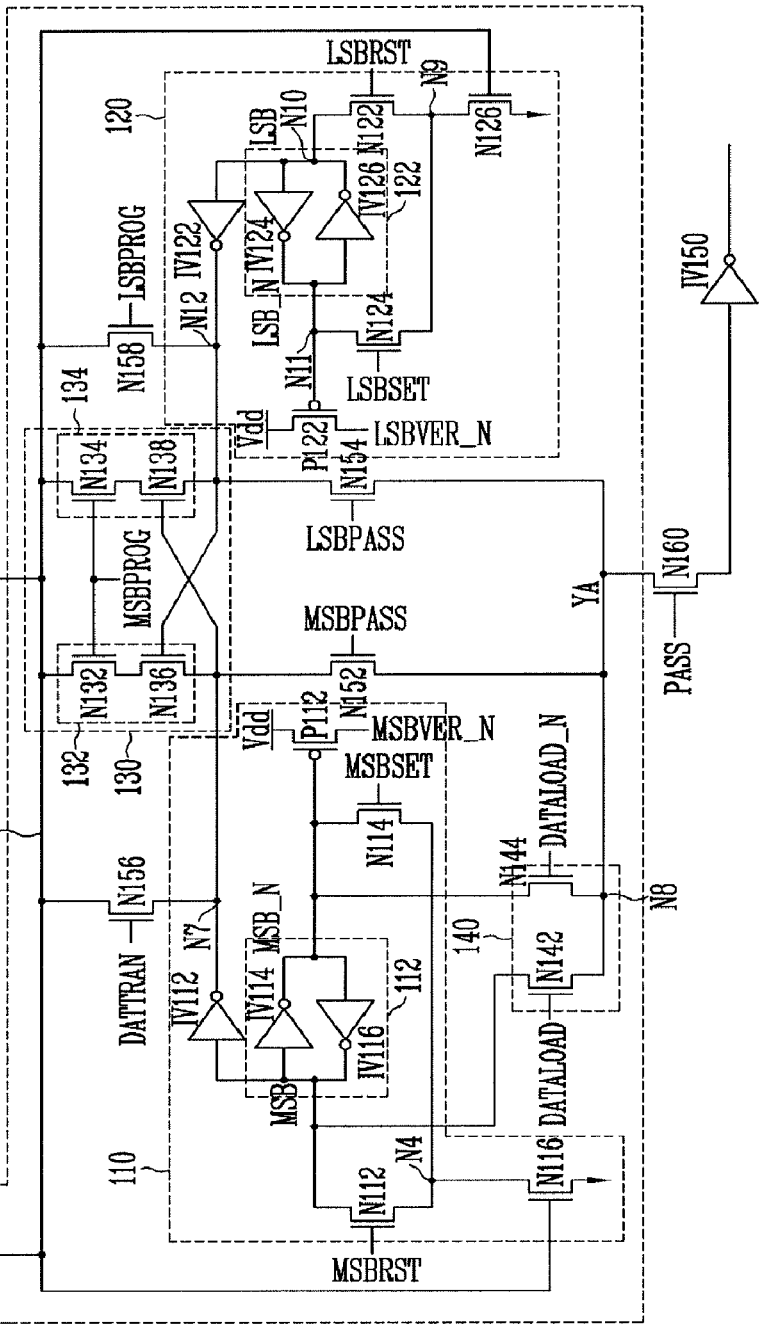

PV1 verify

PV2 verify

MSBRST

FIG. 4C-1
PV3 verify
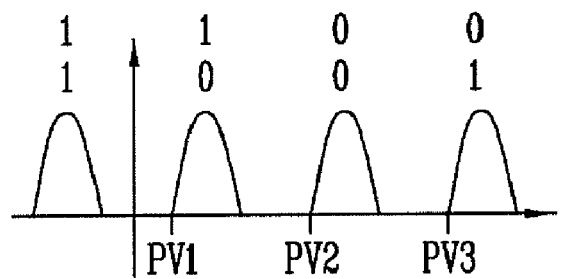
FIG. 4C-2
⎍ LSBRST
FIG. 4C-3
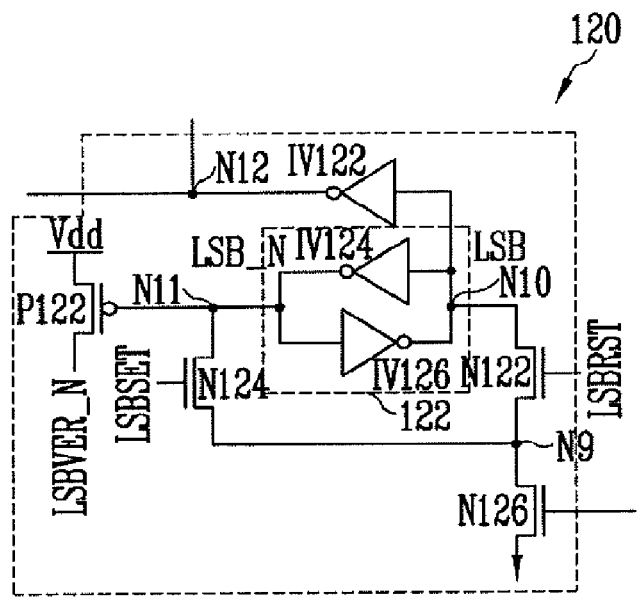

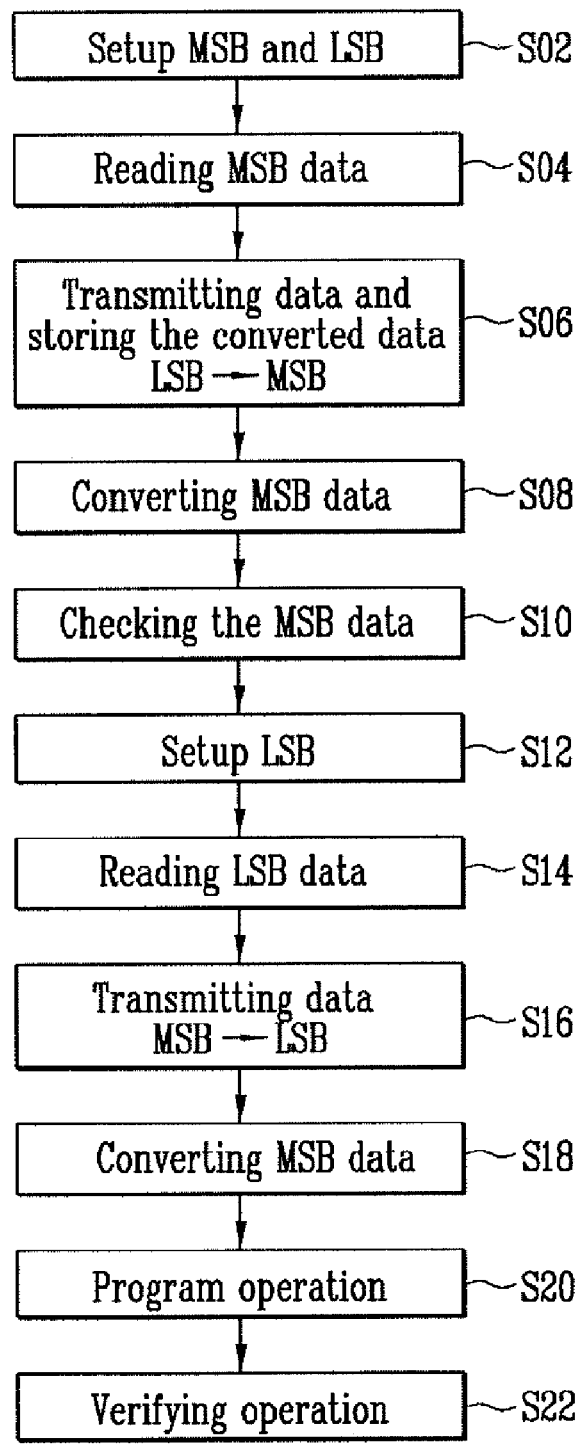

MULTI-LEVEL CELL COPYBACK PROGRAM METHOD IN A NON-VOLATILE MEMORY DEVICE

CROSS-REFERENCE TO RELATED APPLICATIONS

This application claims priority from Korean Patent Application No. 2006-106654, filed on Oct. 31, 2006 and Korean Patent Application No. 2007-54383, filed on Jun. 4, 2007, the contents of which are incorporated herein by reference in its entirety.

BACKGROUND OF THE INVENTION

The present invention relates to a multi-level cell copyback method in a non-volatile memory device.

In a common non-volatile memory device, one string is made up of a plurality of memory cells, and a memory cell array includes a plurality of strings.

A common method of driving the memory cell operates in accordance with level of a threshold voltage having two states. Here, a first state corresponding to one of a program area and an erase area means the level of the threshold voltage in case that the level of the threshold voltage is higher than a given level, and a second state corresponding to the other area indicates the level of the threshold voltage in case that the level of the threshold voltage is smaller than the given level.

For example, a memory cell is programmed or erased in accordance with level of a threshold voltage having a first state and a second state, wherein the first state corresponds to a level of the threshold voltage smaller than a reference voltage, i.e. 0V and the second state corresponds to the level of the threshold voltage higher than 0V. This memory cell is referred to as a single level cell (hereinafter, referred to as "SLC"). Here, since the SLC considers only two states on the basis of the reference voltage, the SLC may store accurately data. However, the SLC is not good to process mass storage data.

To improve this demerit of the SLC, a multi-level cell (hereinafter, referred to as "MLC") has been developed.

The MLC has the same structure as the SLC in physical view. However, the MLC has at least four threshold voltage levels in logical view. That is, the threshold voltage is divided as a program area and an erase area based on a reference voltage like the SLC, but at least three threshold voltage levels exist in the program area unlike the SLC. As a result, since the MLC drives at least four states with the same physical structure as the SLC, the MLC has excellent data processing capacity compared to the SLC.

In other words, the non-volatile memory device having the MLC uses a method of storing two data in one memory cell. As a result, a method of driving the non-volatile memory device in accordance with threshold voltage distribution and bias condition of the MLC is complicated compared to a method of driving the non-volatile memory device having the SLC.

A copyback operation of the method means an operation of transferring data stored in a first memory cell into a second memory cell having different address from the first memory cell.

If algorithm for the copyback operation is existed, data in a memory cell are sensed by using a page buffer, and then are read to a device in outside of a chip. Subsequently, the read data are stored in the device, and then the stored data should be again stored in a memory cell.

In addition, in case that the non-volatile memory device does not have extra storage section except a page buffer in the chip, the stored data are read, and then the read data should be again stored in the device in outside of the chip. Accordingly, the non-volatile memory device having the MLC should use algorithm for the copyback operation different from algorithm in the non-volatile memory device having the SLC.

On the other hand, in case that data of a source page are damaged during the copyback operation, the damaged data should be amended.

Additionally, an LSB program operation and an MSB program operation are performed in accordance with the copyback operation of the MLC. Here, since a verifying operation is performed about each of the program operations, unified verifying operation has been required.

SUMMARY OF THE INVENTION

It is a feature of the present invention to provide a multi-level cell copyback method in a non-volatile memory device for amending damaged data of a source page.

It is another feature of the present invention to provide a multi-level cell copyback method in a non-volatile memory device for performing unified verifying operation about an LSB program operation and an MSB program operation.

A multi-level cell copyback program method in a non-volatile memory device according to one example embodiment of the present invention includes reading LSB data of a source page, and storing the read LSB data in a second register of a page buffer; transmitting the data stored in the second register to a first register coupled to a data inputting circuit, and storing the transmitted data in the first register; amending the data stored in the first register through the data inputting circuit; transmitting the amended data to the second register; and storing the transmitted data in the second register, and LSB-programming corresponding data to a target page in accordance with the data stored in the second register.

A multi-level cell copyback program method in a non-volatile memory device according to another example embodiment of the present invention includes performing a multi-level cell copyback program operation; performing selectively a first verifying operation, a second verifying operation or a third verifying operation in accordance with data stored in an MSB node of the first register or data stored in an LSB node of the second register, wherein the first verifying operation is based on a first verifying voltage, the second verifying operation is based on a second verifying voltage higher than the first verifying voltage, and the third verifying operation is based on a third verifying voltage higher than the second verifying voltage; and performing repeatedly the copyback program operation in accordance with the verifying operation.

As described above, a non-volatile memory device may perform a multi-level cell copyback operation for amending damaged data of a source page. In addition, the non-volatile memory device performs unified verifying operation about an LSB program operation and an MSB program operation, and so area of an ROM storing algorithm related to the verifying operation and area of a control circuit may be reduced.

BRIEF DESCRIPTION OF THE DRAWINGS

The above and other features and advantages of the present invention will become readily apparent by reference to the following detailed description when considered in conjunction with the accompanying drawings wherein:

FIG. 1 is a view illustrating a circuitry of a non-volatile memory device according to one example embodiment of the present invention;

FIGS. 4A-1 to 4A-3 illustrate the first verifying operation based on the first verifying voltage PV1;

FIGS. 4B-1 to 4B-3 illustrate the second verifying operation based on the second verifying voltage PV2;

FIGS. 4C-1 to 4C-3 illustrate the third verifying operation based on the third verifying voltage PV3;

FIG. 5 is a flowchart illustrating an MSB page copyback method of a copyback program method according to one example embodiment of the present invention;

DESCRIPTION OF SPECIFIC EMBODIMENTS

Hereinafter, the preferred embodiments of the present invention will be explained in more detail with reference to the accompanying drawings.

Figures 1, 4A:
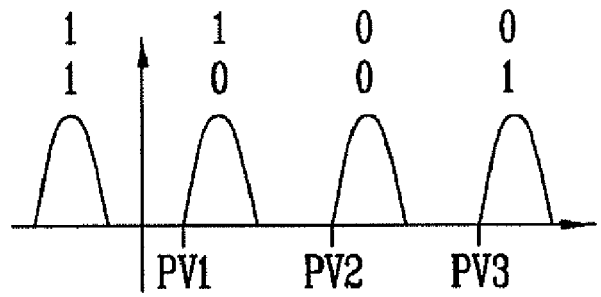
Figures 2, 4A:
Figures 3, 4A:
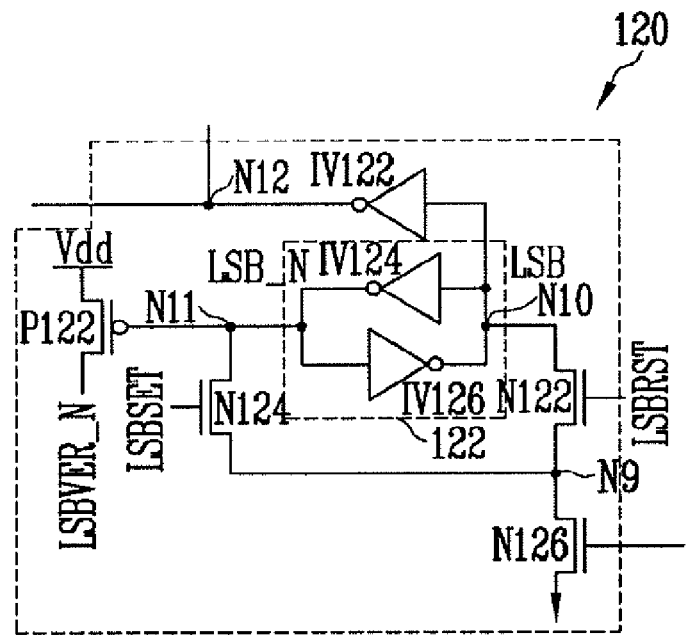

FIG. 1 is a view illustrating a circuitry of a non-volatile memory device according to one example embodiment of the present invention.

The non-volatile memory device of the present embodiment includes a memory cell array and a page buffer.

The page buffer has a bit line selecting circuit 100 for coupling selectively a bit line BLe or BLo to a sensing node SO, a first register 110 and a second register 120 for storing specific data, a data comparing circuit 130 for comparing data stored in the first register 110 with data stored in the second register 120 and transmitting given data to the sensing node SO in accordance with the comparing result, and a data inputting circuit 140.

The bit line selecting circuit 100 includes a plurality of N-MOS transistors N102 to N108.

The N-MOS transistor N102 is coupled between the even bit line BLe and a bias voltage VIRPWR, and is turned on in response to an even discharge signal DISCHe. Here, in case that the N-MOS transistor N102 is turned on, the bias voltage VIRPWR is applied to the even bit line BLe.

The N-MOS transistor N104 is coupled between the odd bit line BLo and the bias voltage VIRPWR, and is turned on an odd discharge signal DISCHo. Here, in case that the N-MOS transistor N104 is turned on, the bias voltage VIRPWR is applied to the odd bit line BLo.

The N-MOS transistor N106 is coupled between the even bit line BLe and the sensing node SO, and is turned on in response to an even bit line selecting signal SELBLe. Here, in case that the N-MOS transistor N106 is turned on, the even bit line BLe is coupled to the sensing node SO.

The N-MOS transistor N108 is coupled between the odd bit line BLo and the sensing node SO, and is turned on in response to an odd bit line selecting signal SELBLo. Here, in case that the N-MOS transistor N108 is turned on, the odd bit line BLo is coupled to the sensing node SO.

The first register 110 includes a latch 112 having two inverters IV114 and IV116, an N-MOS transistor N112 coupled to a first node MSB of the latch 112, an N-MOS transistor N114 coupled to a second node MSB_N of the latch 112, an inverter IV112, and a P-MOS transistor P112 tuned on in accordance with a voltage level of the second node MSB_N, thereby outputting a voltage Vdd having high level to a portion corresponding to an MSB verifying signal MSB-VER_N.

In addition, the first register 110 further includes an N-MOS transistor N116 coupled between a node N4 and a ground, wherein the node N4 is disposed between the N-MOS transistor N112 and the N-MOS transistor N114.

The N-MOS transistor N112 is coupled between the first node MSB and the node N4, and is turned on in response to an MSB reset signal MSBRST.

The N-MOS transistor N114 is coupled between the second node MSB_N and the node N4, and is turned on in accordance with an MSB set signal MSBSET.

The N-MOS transistor N116 is coupled between the node N4 and the ground, and is turned on in accordance with a voltage level of the sensing node SO, thereby providing a ground voltage to the node N4.

The second register 120 includes a latch 122 having two inverters IV124 and IV126, an N-MOS transistor N122 coupled to a first node LSB of the latch 122, an N-MOS transistor N124 coupled to a second node LSB_N of the latch 122, an inverter IV122, and a P-MOS transistor P122 turned on in accordance with a voltage level of the second node LSB_N, thereby outputting the voltage Vdd having high level to a portion corresponding to a verifying signal LSBVER_N. Additionally, the second register 120 further includes an N-MOS transistor N126 coupled between a node N9 and the ground, wherein the node N9 is disposed between the N-MOS transistor N122 and the N-MOS transistor N124.

The N-MOS transistor N122 is coupled between the first node LSB and the node N9, and is turned on in response to an LSB reset signal LSBRST.

The N-MOS transistor N124 is coupled between the second node LSB_N and the node N9, and is turned on in response to a least significant bit (LSB) set signal LSBSET.

The N-MOS transistor N126 is coupled between the node N9 and the ground, and is turned on in accordance with the voltage level of the sensing node SO, thereby providing the ground voltage to the sensing node N9.

The data comparing circuit 130 provides logical product data of data stored in the first register 110 and data stored in the second register 120 to the sensing node SO in response to a most significant bit (MSB) program signal MSBPROG, and includes a first comparing circuit 132 and a second comparing circuit 134.

The first comparing circuit 132 has N-MOS transistors N132 and N136.

The N-MOS transistors N132 and N136 are coupled in serial between the sensing node SO and a node N7.

The N-MOS transistor N132 is turned on in response to the MSB program signal MSBPROG.

The N-MOS transistor N136 is turned on in response to a voltage of a node N12 so that the sensing node SO is coupled to the node N7 or is disconnected from the node N7.

The second comparing circuit 134 includes N-MOS transistors N134 and N138.

The N-MOS transistors N134 and N138 are coupled in serial between the sensing node SO and the node N12.

The N-MOS transistor N134 is turned on in response to the MSB program signal MSBPROG.

The N-MOS transistor N138 is turned on in response to a voltage of the node N7 so that the sensing node SO is coupled to the node N12 or is disconnected from the node N12.

In case that the data comparing circuit 130 is operated, a transistor P150 for precharging is turned on during a given time, thereby precharging the sensing node SO to high level.

Then, the MSB program signal MSBPROG is applied with high level. In this case, the voltage level of the sensing node SO is varied in accordance with voltage levels of the nodes N7 and N12. State of the voltage level is shown in below table.

| Operation of the comparing circuit | Voltage of the node N7 | Voltage of the node N12 | Voltage of the sensing node SO |
|---|---|---|---|
| N136 and N138 are turned on | High | High | High |
| N138 is turned on | High | Low | Low |
| N136 is turned on | Low | High | Low |
| N136 and N138 are turned off | Low | Low | Maintaining a precharge level |

Turn-on of the N-MOS transistors N136 and N138 is determined in accordance with voltage levels of the nodes N7 and N12 as shown in the above table. In addition, it is determined whether or not voltage of each of the nodes N7 and N12 affects to the sensing node SO in accordance with turn-on of the N-MOS transistors N136 and N138.

In case that every voltage of the nodes N7 and N12 has low level, the transistors N136 and N138 are turned off. As a result, transmission of the logical product data is stopped. In this case, the voltage of the sensing node SO is determined in accordance with the precharge level.

The data inputting circuit 140 includes N-MOS transistors N142 and N144.

The N-MOS transistor N142 is coupled between the first node MSB and an input/output terminal YA, and is turned on in response to a data input signal DATALOAD.

In case that the N-MOS transistor N142 is turned on, data of the input/output terminal YA are transmitted to the first node MSB in the first register 110.

The N-MOS transistor N144 is coupled between the second node MSB_N and the input/output terminal YA, and is turned on in response to an inverse data input signal DATALOAD_N.

In case that the N-MOS transistor N144 is turned on, the data of the input/output terminal YA are provided to the second node MSB_N. Accordingly, in case that the data input signal DATALOAD having high level is transmitted under the condition that the input/output terminal YA is coupled to the ground, the N-MOS transistor N142 is turned on. As a result, the first node MSB has low level. In case that the inverse data input signal DATALOAD_N having high level is applied to the N-MOS transistor N144, the N-MOS transistor N144 is turned on. As a result, the second node MSB_N has low level, and so data are inputted.

On the other hand, a transistor N156 for data transmission is coupled between the node N7 and the sensing node SO, and a transistor N158 for data transmission is coupled between the node N12 and the sensing node SO.

The N-MOS transistor N156 is coupled between the sensing node SO and the node N7, and is turned on in response to a data transmitting signal DATTRAN. Accordingly, in case that the N-MOS transistor N156 is turned on, data of the node N7 are transmitted to the sensing node SO.

The N-MOS transistor N158 is coupled between the sensing node SO and the node N12, and is turned on in response to a least significant bit (LSB) program signal LSBPROG. Accordingly, in case that the N-MOS transistor N158 is turned on, data of the node N12 are transmitted to the sensing node SO.

The P-MOS transistor P150 for precharging is coupled between the source voltage Vdd and the sensing node SO, and is turned on in response to a precharge signal PRECH_N having low level. In case that the P-MOS transistor P150 is turned on, the source voltage Vdd is applied to the sensing node SO. As a result, the sensing node SO is precharged to level of the source voltage Vdd.

The non-volatile memory device includes transistors N152, N154 and N160 for transmitting data provided to the nodes N7 and N12 to an outside terminal.

An MSB pass device N152 is embodied with an N-MOS transistor, is coupled between the node N7 and a node N8, and operates in response to an MSB pass signal MSBPASS.

An LSB pass device N154 is embodied with an N-MOS transistor, is coupled between the node N12 and the node N8, and operates in response to an LSB pass signal LSBPASS.

The data pass device N160 is embodied with an N-MOS transistor, and transmits a voltage applied to the node N8 to an inverter IV150 in response to a pass signal PASS.

Hereinafter, a multi-level cell copyback program method used in the non-volatile memory device will be described in detail.

Figure 2:
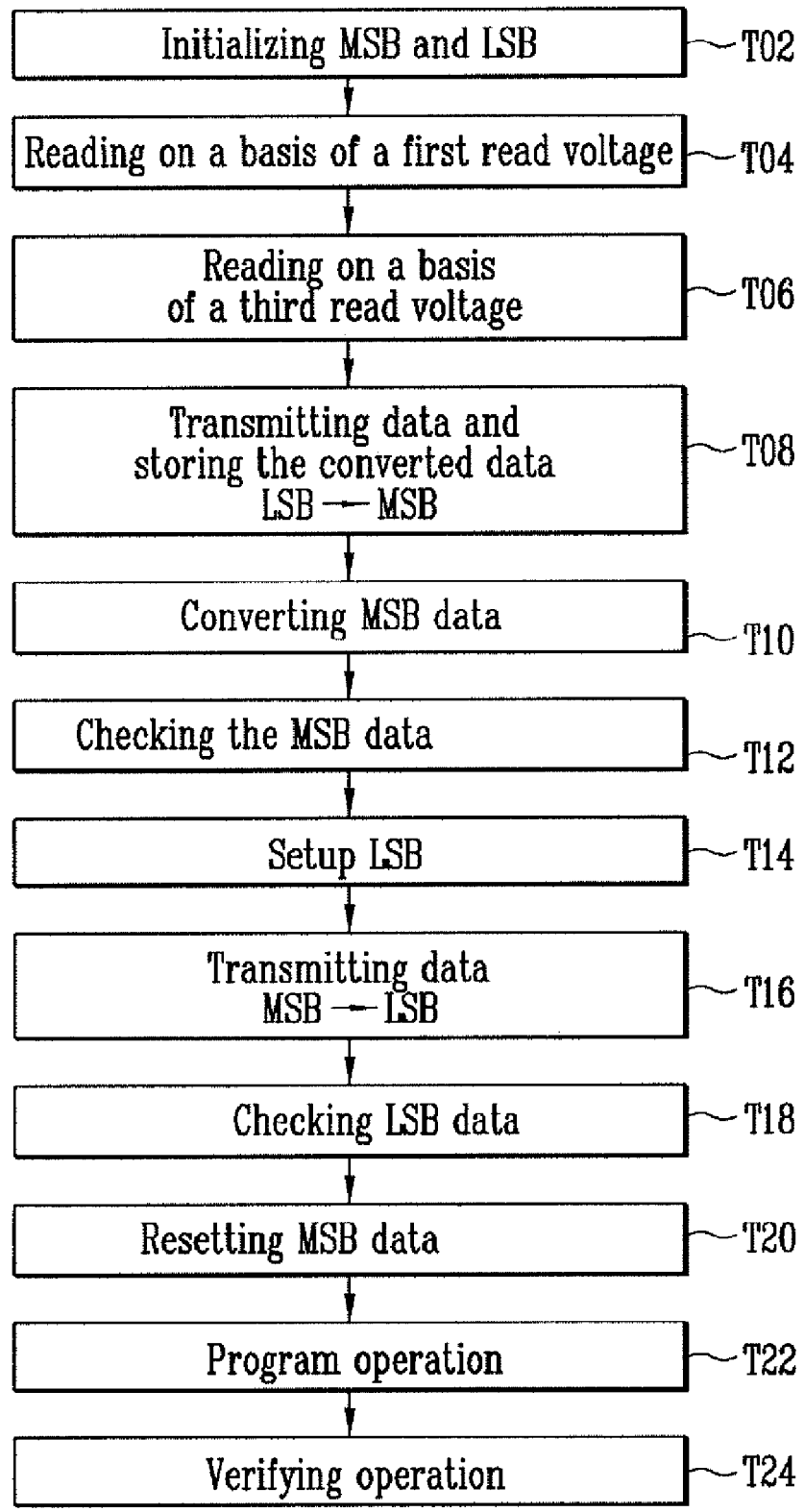
FIG. 2 is a flowchart illustrating an LSB copyback method of a copyback program method according to one example embodiment of the present invention.

FIG. 2 is a flowchart illustrating an LSB copyback method of a copyback program method according to one example embodiment of the present invention.

In step T02, the first node (hereinafter, referred to as "MSB node") of the first register 110 and the first node (hereinafter, referred to as "LSB node") of the second register 120 are initialized.

To initialize the nodes, the precharge signal PRECH_N having low level is transmitted to the transistor P150, thereby turning on the transistor P150. As a result, the voltage having high level is applied to the sensing node SO. In addition, the MSB reset signal MSBRST and the LSB set signal LSBSET having high level are transmitted, and so the transistors N112 and N124 are turned on. Accordingly, the MSB node is initialized to data having low level, and the LSB node is initialized to data having high level.

Next, an LSB data of a source page which are an object of copyback are read, and then are stored in the second register 120 of the page buffer.

Figure 7:
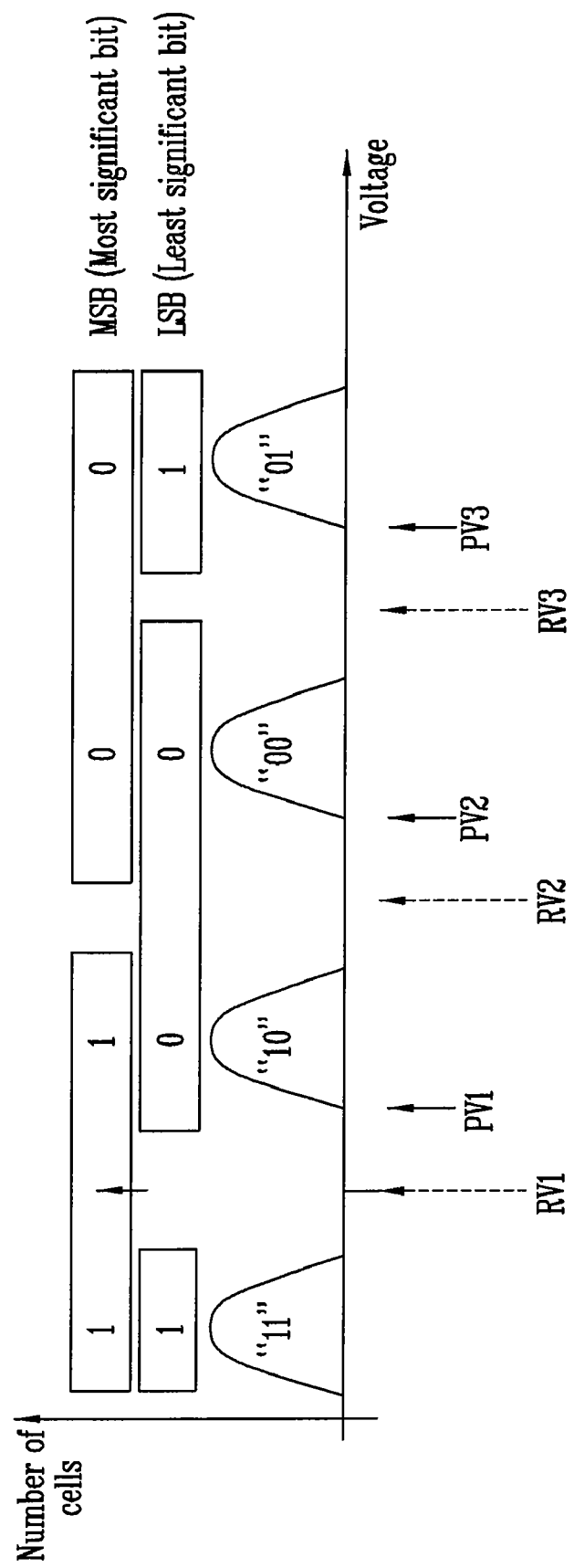
FIG. 7 is a view illustrating change of threshold voltage distribution of multi-level cells in accordance with a copyback process.

In step T04, data of a specific cell are read on the basis of a first read voltage RV1 of FIG. 7, and then are stored in the LSB node. Here, FIG. 7 is a view illustrating change of threshold voltage distribution of multi-level cells in accordance with a copyback process.

To perform the above process, the process uses a method in which the voltage level of the sensing node SO is varied in accordance with a result as to whether or not a corresponding cell is a programmed cell.

That is, in the method, the voltage level of the sensing node SO has high level in case that the corresponding cell is a programmed cell, and has low level in case that the corresponding cell is an erased cell. Here, turn-on of the N-MOS transistor N126 of the second register 120 is determined in accordance with the voltage level of the sensing node SO. In this case, the LSB reset signal LSBRST is provided to the transistor N122 with high level, and so the N-MOS transistor N122 is turned on. Accordingly, in case that a corresponding cell is programmed to a voltage more than the first read voltage RV1 ('10', '00' and '01' in FIG. 7), the ground voltage is applied to the LSB node. As a result, data having low level are stored in the LSB node. However, in case that the corresponding cell is erased ('11' in FIG. 7), the data having high level in the above initialization step are maintained as it is.

In step T06, data of a specific cell are read on the basis of a third read voltage RV3 in FIG. 7, and then are stored in the LSB node.

The read operation is similar to that in the step T04. However, the LSB set signal LSBSET having high level is transmitted to the N-MOS transistor N124 unlike the step T04, and so the N-MOS transistor N124 is turned on. Accordingly, in case that a corresponding cell is programmed to a voltage more than the third read voltage RV3 ('01' in FIG. 7), data having high level are stored in the LSB node. However, in case that the cell is erased ('11', '10' and '00' in FIG. 7), the data stored in the prior step are maintained.

In short, in case that a threshold voltage of the cell is smaller than the first read voltage RV1 and is higher than the third read voltage RV3, i.e. '11' and '01', the data having high level are stored in the LSB node. However, in case that a threshold voltage of the cell is higher than the first read voltage RV1 and is smaller than the third read voltage RV3, i.e. '10' and '00', the data having low level are stored in the LSB node.

In another example embodiment of the present invention, the LSB copyback method may further includes a step of transmitting new data to the MSB node. For example, the method may include the step in case that data of a source page related to a copyback operation are to be amended. To perform the step, data stored in a specific register are transmitted to the register coupled to the data inputting circuit 140, and then the data are amended by using the data inputting circuit 140.

Firstly, in step T08, the data stored in the second register 120 are transmitted to the first register 110 and then the transmitted data are stored in the first register 110. To perform the step T08, the sensing node SO is precharged to high level by using the precharge signal PRECH_N, and the LSB program signal LSBPROG and the MSB set signal MSBSET having high level are transmitted to the transistors N158 and N114. Accordingly, in case that the data having low level are stored in the LSB node, i.e. '10' and '00', data having high level are stored in the MSB node. However, in case that the data having high level are stored in the LSB node, i.e. '11' and '01', the data having low level stored in the MSB node are maintained.

In step T10, new data are provided to the MSB node. To perform the step T10, the data input signal DATALOAD or DATALOAD_N having high level is provided to the data inputting circuit 140, thereby amending a voltage level of the MSB node. That is, a level of the data stored in the MSB node may be converted through the above mentioned step.

In step T12, the data stored in the MSB node are checked. For instance, in case that an LSB program is not needed for data stored in whole of the page, i.e. '11' and '10' in FIG. 7, the LSB program is not performed about a corresponding page. The checked result is determined in accordance with a voltage level of the MSB verifying signal MSBVER_N. Since the MSB node maintains low level in case that the LSB program is not needed, i.e. '11' and '01', in FIG. 7, a signal having high level is applied to a gate of the P-MOS transistor P112. Accordingly, the MSB verifying signal MSBVER_N maintains floating state, and the LSB program may not be performed.

In step T14, the second register 120 is initialized before data stored in the first register 110 are again transmitted to the second register 120.

To perform the step T14, the precharge signal PRECH_N having low level is transmitted to the transistor P150, thereby turning on the transistor P150. As a result, the voltage having high level is applied to the sensing node SO. In addition, the LSB set signal LSBSET is provided to the N-MOS transistor N124, thereby turning on the N-MOS transistor N124. As a result, the LSB node is initialized to data having high level.

In step T16, the data stored in the first register 110 are transmitted to the second register 120, and the transmitted data are stored in the second register 120.

To perform the step T16, the sensing node SO is precharged to high level by using the precharge signal PRECH_N, and the data transmitting signal DATTRAN and the LSB reset signal LSBRST are transmitted to the transistor N156 and the transistor N122. Accordingly, in case that the data having low level are stored in the MSB node, i.e. '11' and '01', the data having low level are stored in the LSB node. However, in case that the data having high level are stored in the MSB node, i.e. '10' and '00', the data having high level stored in the LSB node are maintained.

In step T18, the data stored in the LSB node are checked.

For example, in case that an LSB program is not needed for data stored in whole of the page, i.e. '11' and '10' in FIG. 7, the LSB program is not performed about a corresponding page. The checked result is determined in accordance with a voltage level of the LSB verifying signal LSBVER_N. Since the LSB node maintains low level in case that the LSB program is not needed, i.e. '11' and '01' in FIG. 7, the signal having high level is applied to a gate of the P-MOS transistor P112. Accordingly, the LSB verifying signal LSBVER_N maintains floating state, and the LSB program may not be performed about the whole of pages.

In step T20, data stored in the MSB node are initialized. Here, since a LSB program and a verifying operation of object page are performed in accordance with the data stored in the LSB node, the initialization does not affect to the LSB program. To perform the step T20, the precharge signal PRECH_N and the MSB reset signal MSBRST having high level are transmitted to the transistor P150 and the transistor N112, and so data having low level are stored in the MSB node.

In step T22, a program operation is performed in accordance with the data stored in the LSB node. On the other hand, in case that it is discriminated that the LSB program is not needed through the step T12 or T18, the program operation may be omitted.

To perform a copyback program operation, the bit line is precharged to high level, and data to be programmed are provided to the sensing node SO. In this case, the MSB program signal MSBPROG having high level is transmitted to the data comparing circuit 130, and so data of the LSB node are provided to the sensing node SO.

Particularly, since the MSB node is initialized in the prior step, data having high level are transmitted to the node N7. In case of the LSB node in the step T16, data having high level are stored in a cell to be programmed, and data having low level are stored in a cell to be erased. Accordingly, the data having low level are stored in the node N12 in case of the cell to be programmed, and the data having high level are stored in the cell to be erased. Hence, data having high level are transmitted to the sensing node SO in accordance with the operation of the data inputting circuit 140 in case that data having high level are stored in the node N12, i.e. in case of the cell to be erased, and data having low level are provided to the sensing node SO in case that the data having low level are stored in the node N12, i.e. in case of the cell to be programmed. Accordingly, the program operation is performed about only the cell to be programmed.

In step T24, a verifying operation as to whether or not the LSB program is normally performed is performed.

Hereinafter, the verifying operation will be described in detail with reference to accompanying drawings.

Figure 3:
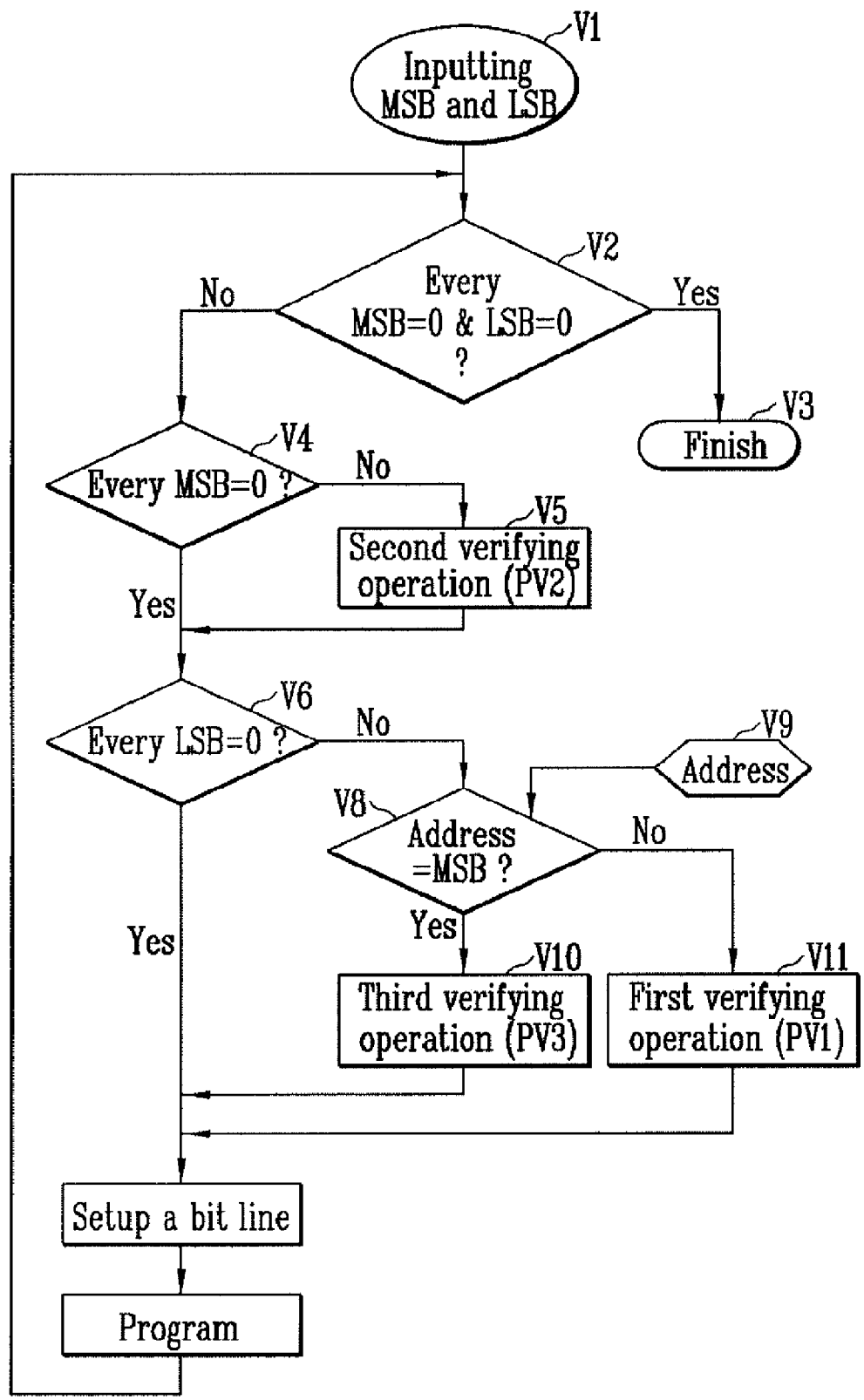
FIG. 3 is a flowchart illustrating a verifying operation according to one example embodiment of the present invention.

FIG. 3 is a flowchart illustrating a verifying operation according to one example embodiment of the present invention.

In step V1, the check result about the data stored in the MSB node (the step T12) and data stored in the LSB node (the step T18) are inputted.

A first verifying operation based on a first verifying voltage, a second verifying operation based on a second verifying voltage higher than the first verifying voltage or a third verifying operation based on a third verifying voltage higher than the second verifying voltage is selectively performed in accordance with the inputted check result.

In step V2, it is discriminated whether or not the every data stored in the MSB node corresponds to data to be erased, i.e. the MSB node has low level, and whether or not every data store din the LSB node corresponds to data to be erased, i.e. the LSB node has low level.

In step V3, in case that the data stored in the MSB node and data stored in the LSB node correspond to data to be erased, the program operation is finished without performing the LSB program.

In step V4, in case that data stored in the MSB node or the data stored in the LSB node does not correspond to data to be erased, it is discriminated whether or not every data stored in the MSB node correspond to data to be erased.

In step V5, in case that every data stored in the MSB node is not data to be erased, the second verifying operation is performed on the basis of the second verifying voltage PV2 in FIG. 7. However, this second verifying operation is verifying operation about the MSB program. Hence, in case that a verifying operation is performed about an LSB copyback program, the step V5 is not performed but the step V6 is directly performed because the MSB node is initialized to 0 in the step T20.

In step V6, it is discriminated whether or not every data stored in the LSB node is data to be erased.

In case that every data stored in the LSB node is not data to be erased, the verifying operation is performed on the basis of the first verifying voltage PV1 or the third verifying voltage PV3 in FIG. 7. Here, the verifying operation is varied in accordance with discrimination result as to whether the present program operation is an LSB program or an MSB program. To perform the verifying operation, information as to whether or not a copyback program about a source page is the LSB program is inputted from an outside device through addressing in step V9, wherein the source page is object of the copyback.

In step V8, it is discriminated through the inputted information whether the copyback program of the source page is the LSB program or the MSB program.

In step V11, in case that the copyback program is the LSB program, the first verifying operation is performed on the basis of the first verifying voltage PV1.

In step V10, in case that the copyback program is the MSB program, the third verifying operation is performed on the basis of the third verifying voltage PV3.

In the present step, since the LSB copyback program is being performed, only the first verifying operation is performed.

Hereinafter, the verifying operation will be described in detail with reference to accompanying drawing.

Figures 1, 4B:
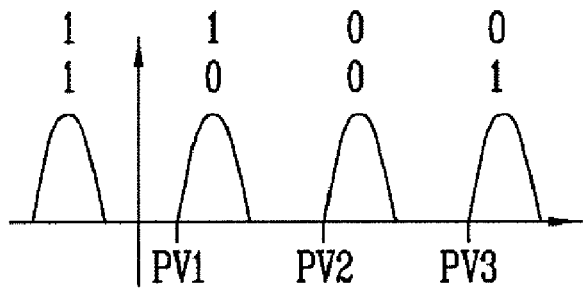
Figures 2, 4B:
Figures 3, 4B:
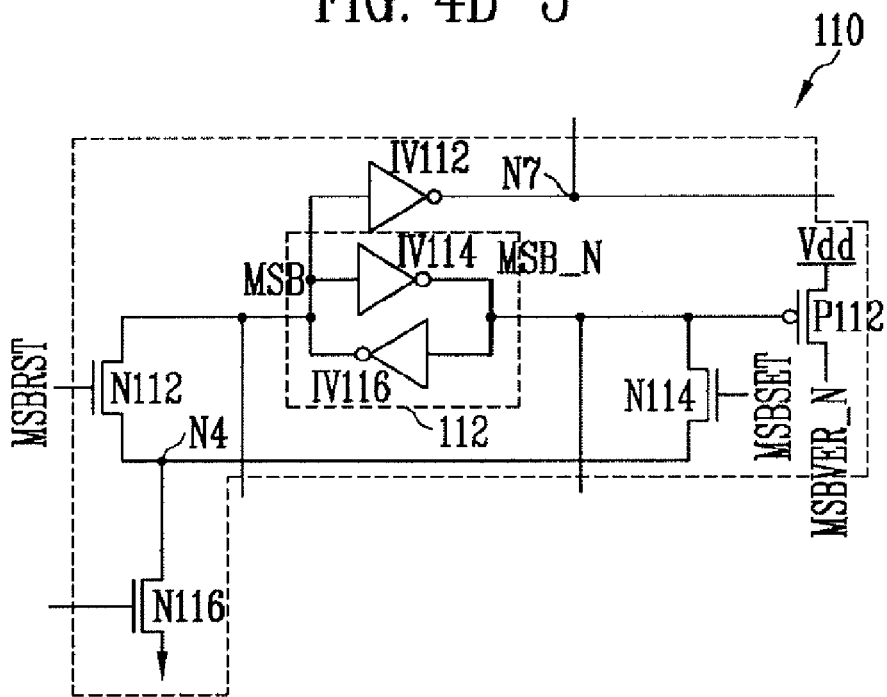

FIG. 4A-1 is a view illustrating the first verifying operation based on the first verifying voltage PV1, and FIG. 4B-1 is a view illustrating the second verifying operation based on the second verifying voltage PV2. FIG. 4C-1 is a view illustrating the third verifying operation based on the third verifying voltage PV3. Here, the second verifying voltage PV2 is higher than the first verifying voltage PV1, and the third verifying voltage PV3 is higher than the second verifying voltage PV2.

Hereinafter, the first verifying operation will be described in detail with reference to FIG. 4A-2 and FIG. 4A-3.

In FIG. 4A-2 and FIG. 4A-3, in case of the LSB program operation, program of a corresponding cell is determined in accordance with level of the data stored in the LSB node. Here, in case that the corresponding cell is a cell to be programmed, data having high level are stored. However, in case that the corresponding cell is a cell to be erased, data having low level are stored.

The program operation is performed, and then the verifying operation sensing a threshold voltage of the corresponding cell is performed. This uses the fact that the voltage level of the sensing node SO is varied in accordance with a result as to whether or not the corresponding cell is programmed.

On the other hand, the LSB reset signal LSBRST having high level is transmitted to the transistor N122. Hence, in case that the sensing node SO has high level according as the corresponding cell is programmed, the data having high level stored in the LSB node are converted into data having low level. However, in case that the cell is sensed as an erased cell according as a threshold voltage of the cell is not increased up to a program level though the program operation is performed, the data having high level stored in the LSB node are maintained as it is.

In case that every cell to be programmed is programmed by repeating the above process, data having low level are stored in the LSB node.

In case that the cell is not a cell to be programmed, the data having low level are stored in the LSB node at first. Accordingly, in case that the verifying operation about program of a corresponding page is finished irrespective of a fact as to whether or not a specific cell is a cell to be programmed, data having low level are stored in the LSB node. As a result, the LSB verifying signal LSBVER_N having a floating state is outputted.

The verifying operation about the LSB program is performed through the above process, and is repeatedly performed until the LSB program is finished.

FIG. 5 is a flowchart illustrating an MSB page copyback method of a copyback program method according to one example embodiment of the present invention.

In step S02, the MSB node of the first register 110 and the LSB node of the second register 120 are initialized.

To performing the initialization, the precharge signal PRECH_N having low level is transmitted to the transistor P150, thereby turning on the transistor P150. As a result, the voltage having high level is applied to the sensing node SO. In addition, the MSB reset signal MSBRST and the LSB set signal LSBSET having high level are transmitted to the N-MOS transistor N112 and the N-MOS transistor N124, thereby turning on the N-MOS transistors N112 and N124. As a result, the MSB node is initialized to data having low level, and the LSB node is initialized to data having high level.

Subsequently, data stored in the source page which is object of the copyback are read and stored. Here, since the present step is a MSB copyback program step, the data stored in the MSB page are read. To perform the above read operation, data of a specific cell are read on the basis of a second read voltage RV2 in FIG. 7 and then are stored in the LSB node in step S04. This uses the fact that the voltage level of the sensing node SO is varied in accordance with a result as to whether or not the corresponding cell is programmed. That is, this uses the fact that the voltage level of the sensing node SO has high level in case that the corresponding cell is programmed and has low level in case that the corresponding cell is erased. Accordingly, turn-on of the N-MOS transistor N126 in the second register 120 is determined in accordance with the voltage level of the sensing node SO. In this case, the N-MOS transistor N122 is turned on by transmitting the LSB reset signal LSBRST having high level. Hence, a ground voltage is applied to the LSB node in case that a corresponding cell is programmed to a voltage more than the second read voltage, i.e. '00' and '01' in FIG. 7, and so data having low level are stored in the LSB node. However, in case that the cell is erased, i.e. '11' and '10' in FIG. 7, data having high level initialized in the above step are maintained as it is.

In one example embodiment of the present invention, the MSB page copyback method may further include a step of providing new data to the MSB node. For example, the method may include the step in case that data of a source page related to the copyback operation are to be amended. To perform the step, data stored in a specific register are transmitted to the register coupled to the data inputting circuit 140, and then the data are amended by using the data inputting circuit 140.

Firstly, in step S06, the data stored in the second register 120 are transmitted to the first register 110 and then the transmitted data are stored in the first register 110. To perform the step S06, the sensing node SO is precharged to high level by using the precharge signal PRECH_N, and the LSB program signal LSBPROG and the MSB set signal MSBSET having high level are transmitted to the transistors N158 and N114. Accordingly, in case that the data having low level are stored in the LSB node, i.e. '00' and '01', data having high level are stored in the MSB node. However, in case that the data having high level are stored in the LSB node, i.e. '11' and '10', the data having low level stored in the MSB node are maintained.

In step S08, new data are provided to the MSB node. To perform the step S08, the data input signal DATALOAD or DATALOAD_N having high level is provided to the data inputting circuit 140, thereby amending a voltage level of the MSB node. That is, a level of the data stored in the MSB node may be converted through the above mentioned step.

In step S10, the data stored in the MSB node are checked. For instance, in case that an MSB program is not needed for data stored in whole of the page, i.e. '11' and '10' in FIG. 7, the MSB program may be not performed about a corresponding page. The checked result is determined in accordance with a voltage level of the MSB verifying signal MSBVER_N. Since the MSB node maintains low level in case that the MSB program is not needed, i.e. '11' and '01' in FIG. 7, a signal having high level is applied to a gate of the P-MOS transistor P112. Accordingly, the MSB verifying signal MSBVER_N maintains floating state, and the MSB program may not be performed about whole of the page.

In step S12, the second register 120 is initialized before data stored in the first register 110 are again transmitted to the second register 120.

To perform the step S12, the precharge signal PRECH_N having low level is transmitted to the transistor P150, thereby turning on the transistor P150. As a result, the voltage having high level is applied to the sensing node SO. In addition, the LSB set signal LSBSET is provided to the N-MOS transistor N124, thereby turning on the N-MOS transistor N124. As a result, the LSB node is initialized to data having high level.

In step S14, state of a target page programmed by the LSB copyback program operation is read. In other words, it is discriminated whether or not an LSB program is performed about a corresponding cell of the target cell. Here, data of a specific cell are read on the basis of the first read voltage RV1 and then stored in the LSB node.

To perform the above process, the process uses the fact that the voltage level of the sensing node SO is varied in accordance with a result as to whether or not a corresponding cell is a LSB programmed cell.

That is, the process uses the fact that the voltage level of the sensing node SO has high level in case that the corresponding cell is the LSB programmed cell, and has low level in case that the corresponding cell is an erased cell. Here, turn-on of the N-MOS transistor N126 of the second register 120 is determined in accordance with the voltage level of the sensing node SO. In this case, the LSB reset signal LSBRST is applied to the transistor N122 with high level, and the N-MOS transistor N122 is turned on. Accordingly, in case that a corresponding cell is LSB-programmed ('10' and '00' in FIG. 7), the ground voltage is applied to the LSB node. As a result, data having low level are stored in the LSB node. However, in case that the corresponding cell is not LSB-programmed ('11' and '01' in FIG. 7), the data having high level initialized in the above step are maintained as it is.

In step S16, the data stored in the first register 110 are transmitted to the second register 120, and are stored in the second register 120. That is, the data stored in the second register 120 is reset.

To perform the step S16, the sensing node SO is precharged to high level by using the precharge signal PRECH_N, and the data transmitting signal DATTRAN and the LSB reset signal LSBRST are transmitted to the transistor N156 and the transistor N122. Accordingly, in case that data having low level are stored in the MSB node, i.e. '11' and '10', data having low level are stored in the LSB node. In other words, the data having low level are stored in the LSB node irrespective of the LSB copyback program, and thus the MSB copyback is not performed about a corresponding cell.

On the other hand, in case that data having high level are stored in the MSB node, i.e. '00' and '01', the data stored in the LSB node are maintained as it is. Hence, the data having high level are maintained in case that the data stored in the LSB node has high level, i.e. '01', and data having low level is maintained in case that the data stored in the LSB node has low level, i.e. '00'.

A cell ('01') where only a most significant bit is to be programmed without programming a least significant bit and a cell ('00') where a least significant bit and a most significant bit are to be programmed may be separated through the above operation.

However, since data having high level are stored in the LSB node and the MSB node in the present condition in case of '01' data, the voltage level of the sensing node SO is not converted to low level when the MSB program operation is performed by using the data comparing circuit 130. As a result, the MSB program is not performed, and so extra MSB data conversion process is performed in step S18.

The sensing node SO is precharged to high level for the data conversion process, and data of the nodes N7 and N12 are compared by transmitting the MSB program signal MSBPROG to the data comparing circuit 130.

In case that data having high level are stored in the nodes N7 and N12 in accordance with operation of the data comparing circuit 130, i.e. the LSB node and the MSB node have low level ('11' and '10'), data having high level are transmitted to the sensing node SO. In case that data having low level are stored in the node N7 or the node N12, i.e. the LSB node and the MSB node have low level and high level or the LSB node and the MSB node have high level and low level ('00'), data having low level are provided to the sensing node SO. In case that data having low level are stored in the nodes N7 and N12, i.e. each of the LSB node and the MSB node has high level ('01'), the data comparing circuit 130 is not operated. Hence, the precharged voltage level is maintained as it is. In this case, the MSB program is performed about only the cell '00'. Here, the MSB program should be programmed about the cell '01', but is not performed since the sensing node SO maintains high level in the present step.

To amend this phenomenon, the MSB reset signal MSBRST is transmitted to the first register 110. Accordingly, data stored in the MSB node are converted into data having low level only in case that the sensing node SO maintains high level, i.e. '11', '10' and '01'. Here, since data having low level are stored in the MSB node in case of '11' and '10', the data are not converted.

However, since data having high level are stored in the MSB node in case of '01', the data having high level are converted into data having low level. This is for performing data conversion about only '01' data. As a result, in case of '11' and '10', data having low level are stored in each of the LSB node and the MSB node through the above process. In case of '01', data having high level and data having low level are stored in the LSB node and the MSB node, respectively. In case of '00', data having low level and data having high level are stored in the LSB node and the MSB node, respectively.

In step S20, a program operation is performed in accordance with the data set in the above process. However, in case that it is discriminated that the MSB program does not have to be performed in the above step S10, the MSB program operation may be omitted.

On the other hand, the bit line is precharged to high level for the copyback program operation, and data to be programmed are transmitted to the sensing node SO. In this case, the MSB program signal MSBPROG having high level is provided to the data comparing circuit 130, and so data of the LSB node and the MSB node are transmitted to the sensing node SO.

In case that data having high level are stored in the nodes N7 and N12 in accordance with operation of the data comparing circuit 130, i.e. '11' and '10', data having high level are transmitted to the sensing node SO. In case that data having low level are stored in the node N7 or the node N12, i.e. '00' and '01', data having low level are provided to the sensing node SO. Accordingly, the program operation is performed about only a cell corresponding to '00' and '01'.

In step S22, a verifying operation about the MSB program is performed.

Hereinafter, the verifying operation will be described in detail with reference to drawing FIG. 3.

The verifying operation in FIG. 3 may be applied to the verifying operation about the LSB program and the verifying operation about the MSB program.

In step V1, the check result about the data stored in the MSB node (the step T12) are inputted.

In step V2, it is discriminated whether or not the every data stored in the MSB node corresponds to data to be erased, i.e. the MSB node has low level, and whether or not every data store din the LSB node corresponds to data to be erased, i.e. the LSB node has low level.

In step V3, in case that the data stored in the MSB node and data stored in the LSB node correspond to data to be erased, the program operation is finished without performing the MSB program.

In step V4, in case that data stored in the MSB node or the data stored in the LSB node does not correspond to data to be erased, it is discriminated whether or not every data stored in the MSB node corresponds to data to be erased.

In step V5, in case that every data stored in the MSB node is not data to be erased, the second verifying operation is performed on the basis of the second verifying voltage PV2 in FIG. 7.

Hereinafter, the second verifying operation will be described in detail with reference to FIGS. 4B-1 to 4B-3.

In case of the MSB program operation, a voltage level and the sensing node SO and program of a corresponding cell are determined in accordance with level of the data stored in the MSB node and the LSB node. Here, in case that the corresponding cell is a cell to be programmed, first data are stored in the LSB node and second data opposed to the first data are stored in the MSB node. As a result, data having low level are transmitted to the sensing node SO. However, in case that the corresponding cell is a cell to be erased, data having high level are provided to the sensing node SO.

The program operation is performed, and then the verifying operation sensing a threshold voltage of the corresponding cell is performed. This uses the fact that the voltage level of the sensing node SO is varied in accordance with a result as to whether or not the corresponding cell is programmed.

On the other hand, the MSB reset signal MSBRST having high level is transmitted to the transistor N112. Hence, in case that the sensing node SO has high level according as the corresponding cell is programmed, the data having high level stored in the MSB node is converted into data having low level. However, in case that the cell is sensed as an erased cell according as a threshold voltage of the cell is not increased up to a program level though the program operation is performed, the data having high level stored in the MSB node are maintained as it is.

In case that every cell to be programmed is programmed by repeating the above process, data having low level are stored in the MSB node.

In case that the cell is not a cell to be programmed, the data having low level are stored in the MSB node at first. Accordingly, in case that the verifying operation about program of a corresponding page is finished irrespective of a fact as to whether or not a specific cell is a cell to be programmed, the MSB node stores data having low level. As a result, the MSB verifying signal MSBVER_N having a floating state is outputted.

On the other hand, in case of '01' data, the '01' data correspond to data to be programmed because the sensing node SO has low level. However, since the data having low level are stored in the MSB node, the second verifying operation is not performed. Here, the third verifying operation is performed about the program of the data on the basis of the third verifying voltage.

In step V6, it is discriminated whether or not every data stored in the LSB node is data to be erased.

In case that every data stored in the LSB node is not data to be erased, the verifying operation is performed on the basis of the first verifying voltage PV1 or the third verifying voltage PV3 in FIG. 7. Here, the verifying operation is varied in accordance with discrimination result as to whether present program operation is an LSB program or an MSB program. To perform the verifying operation, information as to whether or not a copyback program about a source page is the LSB program is inputted from an outside device through addressing in step V9, wherein the source page is object of a copyback.

In step V8, it is discriminated through the inputted information whether the copyback program of the source page is the LSB program or the MSB program.

In step V10, in case that the copyback program corresponds to the MSB program in the present step, the third verifying operation is performed on the basis of the third verifying voltage PV3.

Hereinafter, the third verifying operation will be described in detail with reference to FIGS. 4C-1 to 4C-3.

The third verifying operation is similar to the verifying operations in FIG. 4A-1 and FIG. 4B-1. However, the third verifying operation is performed on the basis of the third verifying voltage PV3.

The third verifying operation is performed by transmitting the LSB reset signal LSBRST having high level. Hence, in case that the sensing node SO has high level according as the corresponding cell is programmed, the data having high level stored in the LSB node is converted into data having low level. However, in case that the cell is sensed as an erased cell according as a threshold voltage of the cell is not increased up to a program level though the program operation is performed, the data having high level stored in the LSB node are maintained as it is.

In case that every cell to be programmed is programmed by repeating the above process, data having low level are stored in the LSB node.

In case that the cell is not a cell to be programmed, the data having low level are stored in the MSB node at first. Accordingly, in case that the verifying operation about program of a corresponding page is finished irrespective of a fact as to whether or not a specific cell is a cell to be programmed, the LSB node stores data having low level. As a result, the LSB verifying signal LSBVER_N having a floating state is outputted.

The verifying operation about the LSB program is performed through the above process. In addition, the program operation and the verifying operation is repeatedly performed until the LSB program is finished.

Figure 6:
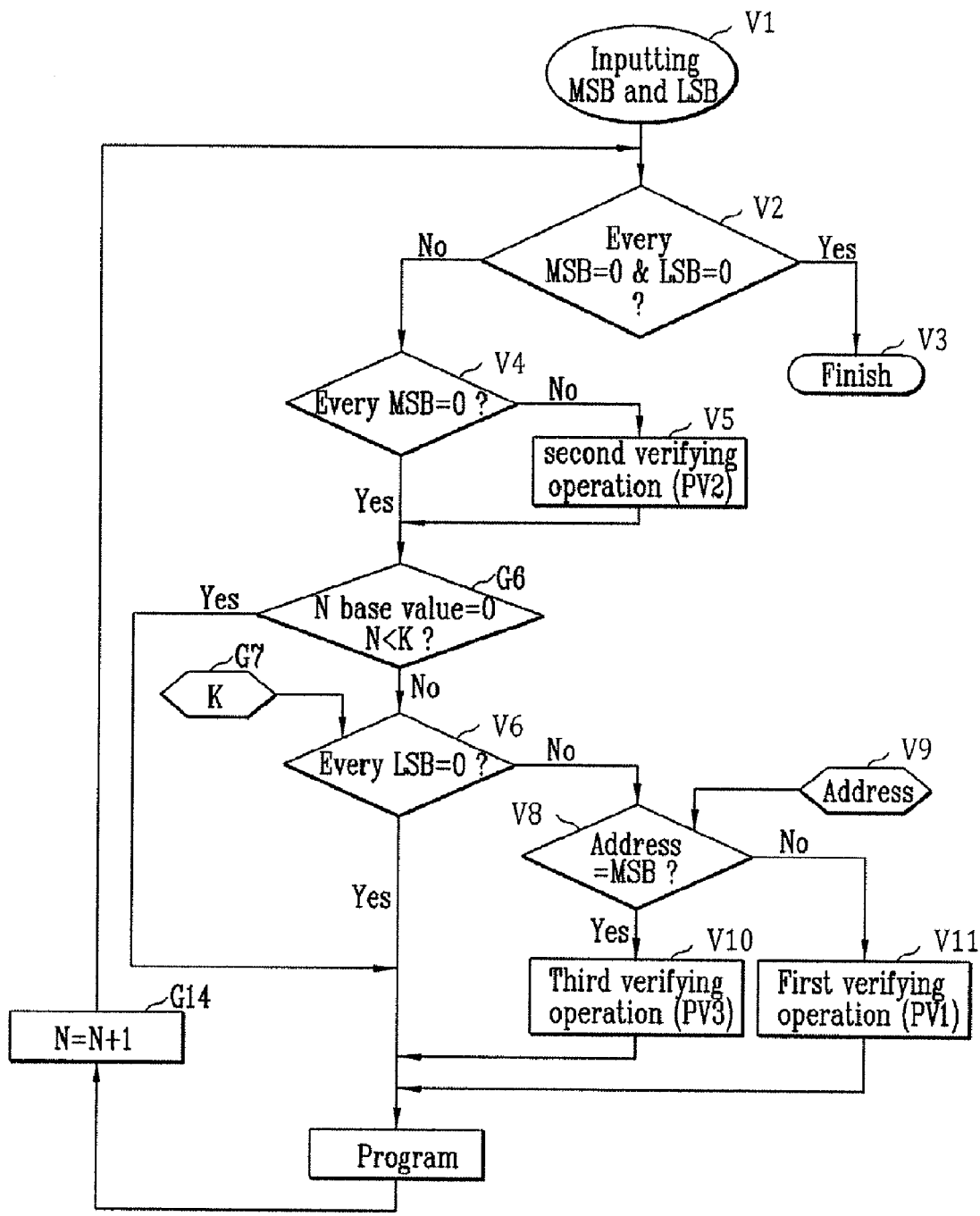
FIG. 6 is a flowchart illustrating a verifying operation according to still another example embodiment of the present invention.

FIG. 6 is a flowchart illustrating a verifying operation according to still another example embodiment of the present invention.

The verifying operation is similar to that in FIG. 3. However, a step of discriminating whether or not the verifying operation about the LSB program is performed during the verifying operation about the MSB program is omitted during a given time.

That is, in case that '11' data or '10' data are MSB-programmed to '00' data, a step of discriminating whether or not the verifying operation about the LSB program is performed is omitted during the given time. As a result, a time required for the verifying operation may be reduced.

The verifying operation in FIG. 6 may be applied to the verifying operation about the LSB program and the verifying operation about the MSB program.

In step G1, the check result of the data stored in the MSB node (the step T12 in FIG. 2) are input.

In step G2, a determination is made whether the data stored in the MSB node and the LSB node corresponds to data to be erased, i.e., the MSB node and the LSB node each have a low level.

In step G3, if the data stored in the MSB node and the LSB node correspond to data to be erased, the program operation is finished without performing the MSB program.

In step G4, if the data stored in the MSB node or the LSB node does not correspond to data to be erased, a determination is made whether the data stored in the MSB node corresponds to data to be erased.

In step G5, if the data stored in the MSB node is not data to be erased, a second verifying operation is performed based on the second verifying voltage PV2 in FIG. 7.

Hereinafter, the second verifying operation will be described in detail with reference to FIG. 4B.

In the MSB program operation, a voltage level of the sensing node SO and program of a corresponding cell are determined in accordance with a level of the data stored in the MSB node and the LSB node. If the corresponding cell is a cell to be programmed, first data are stored in the LSB node and second data opposed to the first data are stored in the MSB node. As a result, data having a low level are transmitted to the sensing node SO. However, if the corresponding cell is a cell to be erased, data having a high level are provided to the sensing node SO.

The program operation is performed, and then the verifying operation for sensing a threshold voltage of the corresponding cell is performed. The voltage level of the sensing node SO is varied in accordance with a result of whether the corresponding cell is programmed.

The MSB reset signal MSBRST having a high level is transmitted to the transistor N112. If the sensing node SO has a high level when the corresponding cell is programmed, data having a high level stored in the MSB node is converted into data having a low level. However, if the cell is sensed as an erased cell when a threshold voltage of the cell is not increased up to a program level even though the program operation is performed, data having a high level stored in the MSB node is maintained.

In the event that every cell to be programmed is programmed by repeating the above process, data having a low level is stored in the MSB node.

If the cell is not to be programmed, data having a low level is initially stored in the MSB node. If the verifying operation about program of a corresponding page is finished irrespective of whether a specific cell is to be programmed, the MSB node stores data having a low level. As a result, the MSB verifying signal MSBVER_N having a floating state is output.

Data '01' corresponds to data to be programmed because the sensing node SO has a low level. However, since data having a low level is stored in the MSB node, the second verifying operation is not performed. In this case, the third verifying operation is performed about the program of the data based on the third verifying voltage.

In step G8, a determination is made whether the data stored in the LSB node is to be erased.

If the data stored in the LSB node is not to be erased, the verifying operation is performed based on the first verifying voltage PV1 or the third verifying voltage PV3 in FIG. 7. The verifying operation is varied in accordance with the determination result of whether the present program operation is an LSB program or an MSB program. To perform the verifying operation, information as to whether a copyback program about a source page is the LSB program is input from an external device through addressing in step G9, wherein the source page is an object of a copyback.

In step G10, a determination is made using the input information whether the copyback program of the source page is the LSB program or the MSB program.

In step G11, if the copyback program corresponds to the MSB program in the present step, the third verifying operation is performed based on the third verifying voltage PV3.

In step G12, if the copyback program is the LSB program, the first verifying operation is performed based on the first verifying voltage PV1.

In step G13, the program operation is performed.

In step G7, a number of the omitting is preset as K.

A performance number of the verifying operation is counted in response to repetition of the verifying operation in step G14 and it is discriminated whether or not the performance number is higher than K in step G6.

The step of discriminating whether or not the verifying operation about the LSB program is performed is omitted until the performance number is higher than K. However, in case that the performance number is higher than K, the step of discriminating whether or not the verifying operation about the LSB program is performed is performed. Then, the first verifying operation or the third verifying operation is performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-level cell copyback program method in a nonvolatile memory device, the method comprising:
   initializing a first register and a second register of a page buffer;
   performing a first read operation of a source page based on a first read voltage to store data obtained by the first read operation on the second register;
   performing a second read operation of the source page based on a third read voltage higher than the first read voltage to store data obtained by the second read operation on the second register;
   performing a least significant bit (LSB) program operation of a target page by changing a voltage level of a sensing node in the page buffer based on the data stored on the first and second registers;
   discriminating whether or not the performance number of the LSB-program operation is higher than a given number;
   performing an LSB-verifying operation of the target page in accordance with a result of the discriminating process, wherein the LSB-verifying operation is performed when the number of the LSB-program operation is higher than the given number;
   initializing the first register and the second register of the page buffer;
   performing a third read operation of the source page based on a second read voltage between the first read voltage and the third read voltage to store data obtained by the second register;
   transmitting the data obtained by the third read operation to the first resister;
   initializing the second resister of the page buffer;
   performing a fourth read operation of the target page based on the first read voltage to store data obtained by the fourth read operation on the second register;
   changing or maintaining the data stored on the first register in accordance with the data stored on the first register and the second register; and
   performing a most significant bit (MSB) program operation and an MSB-verifying operation by changing a voltage level of the sensing node in the page buffer based on data of the first and second registers.

2. The method of claim 1, wherein the step of performing the second read operation includes:
   changing or maintaining data obtained by the first read operation in accordance with the second read operation.

3. The method of claim 1, wherein the step of performing the LSB-program operation includes:
   changing or maintaining the voltage level of the sensing node in the page buffer based on the data stored on the first and second registers.

4. The method of claim 1, wherein the LSB-verifying operations is performed after the performance number is higher than the given number.

5. The method of claim 1, wherein the LSB-verifying operations is omitted before the performance number is higher than the given number.

6. The method of claim 1, wherein the step of performing the MSB-program operation and the MSB-verifying operation includes:
   performing the MSB-program operation;
   performing the MSB-verifying operation; and
   repeating the MSB-program operation and the MSB-verifying operation in accordance with a result of the MSB-verifying operation.

* * * * *